United States Patent
Li

(10) Patent No.: US 10,560,055 B2
(45) Date of Patent: Feb. 11, 2020

(54) VOLTAGE MODE POWER COMBINER FOR RADIO FREQUENCY LINEAR POWER AMPLIFIER

(71) Applicant: Skyworks Solutions, Inc., Woburn, MA (US)

(72) Inventor: Qiang Li, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 16/413,846

(22) Filed: May 16, 2019

(65) Prior Publication Data

US 2019/0273469 A1 Sep. 5, 2019

Related U.S. Application Data

(63) Continuation of application No. 15/608,345, filed on May 30, 2017, now Pat. No. 10,320,333, which is a continuation of application No. 14/817,447, filed on Aug. 4, 2015, now Pat. No. 9,685,918.

(60) Provisional application No. 62/032,941, filed on Aug. 4, 2014.

(51) Int. Cl.
```
H03F 1/32    (2006.01)
H03F 1/02    (2006.01)
H03F 1/56    (2006.01)
H03F 3/21    (2006.01)
H03F 3/191   (2006.01)
```

(52) U.S. Cl.
CPC ........... *H03F 1/0205* (2013.01); *H03F 1/565* (2013.01); *H03F 3/191* (2013.01); *H03F 3/211* (2013.01); *H03F 2200/432* (2013.01); *H03F 2200/451* (2013.01); *H03F 2203/21106* (2013.01); *H03F 2203/21139* (2013.01)

(58) Field of Classification Search
CPC .............................. H03F 1/3252; H03F 3/191
USPC ............................................. 330/295, 124 R
See application file for complete search history.

(56) References Cited

U.S. PATENT DOCUMENTS

| | | | |
|---|---|---|---|
| 6,545,542 B2 | 4/2003 | Matsuyoshi et al. | |
| 6,949,974 B2 | 9/2005 | Ohnishi et al. | |
| 7,741,904 B2 * | 6/2010 | Ichitsubo | ............ H03G 3/3036 330/133 |

(Continued)

OTHER PUBLICATIONS

Kim, Jihwan; Yoon, Youngchang; Kim, Hyungwook; An, Hwan Kyu; Kim, Woonyun; Kim, Hyun-Woong; Lee, Chang-Cho; Kornegay, Kevin T.; "A Linear Multi-Mode CMOS Power Amplifier with Discrete Resizing and Concurrent Power Combining Structure"; IEEE Journal of Solid-State Circuits, vol. 46, No. 5, May 2011.

*Primary Examiner* — Henry Choe
(74) *Attorney, Agent, or Firm* — Stetina Brunda Garred & Brucker

(57) ABSTRACT

A radio frequency (RF) power combining amplifier circuit has a circuit input and a circuit output. A first amplifier is connected to the circuit input and to a first bias input. A first output matching network is connected to an output of the first amplifier and to the circuit output. A second amplifier is connected to the circuit input and to a second bias input. A second output matching network is connected to an output of the second amplifier, and to the circuit output. A voltage level of an input signal applied to the circuit input, together with the respective first bias input and the second bias input, selectively activates the first amplifier and the second amplifier.

20 Claims, 6 Drawing Sheets

(56) References Cited

U.S. PATENT DOCUMENTS

| | | | |
|---|---|---|---|
| 7,944,291 B2* | 5/2011 | Jung | H03F 1/0277 |
| | | | 330/124 R |
| 7,952,433 B2* | 5/2011 | An | H03F 1/0266 |
| | | | 330/295 |
| 8,134,409 B2 | 3/2012 | Seki et al. | |
| 8,598,951 B1 | 12/2013 | Hau | |
| 8,890,620 B2 | 11/2014 | Tamanoi et al. | |
| 8,971,830 B2* | 3/2015 | Hadjichristos | H03F 1/0277 |
| | | | 455/127.4 |
| 2011/0037516 A1* | 2/2011 | Nejati | H03F 1/565 |
| | | | 330/124 R |
| 2012/0126891 A1 | 5/2012 | Kim et al. | |
| 2014/0002188 A1 | 1/2014 | Chen et al. | |

\* cited by examiner

VOLTAGE MODE POWER COMBINER FOR RADIO FREQUENCY LINEAR POWER AMPLIFIER

CROSS-REFERENCE TO RELATED APPLICATIONS

This application is a continuation patent application of U.S. patent application Ser. No. 15/608,345, filed May 30, 2017 and entitled "VOLTAGE MODE POWER COMBINER FOR RADIO FREQUENCY LINEAR POWER AMPLIFIER," which is a continuation patent application of U.S. patent application Ser. No. 14/817,447, filed Aug. 4, 2015 and entitled "VOLTAGE MODE POWER COMBINER FOR RADIO FREQUENCY LINEAR POWER AMPLIFIER," now issued as U.S. Pat. No. 9,685,918 which relates to and claims the benefit of U.S. Provisional Application No. 62/032,941, filed Aug. 4, 2014 and entitled "VOLTAGE MODE POWER COMBINER FOR RADIO FREQUENCY LINEAR POWER AMPLIFIER," the entirety of each of the disclosures of which are wholly incorporated by reference herein.

STATEMENT RE: FEDERALLY SPONSORED RESEARCH/DEVELOPMENT

Not Applicable

BACKGROUND

1. Technical Field

The present disclosure relates generally to radio frequency (RF) communications power amplifiers, and in particular, voltage mode power combiners for RF linear power amplifiers.

2. Related Art

Generally, wireless communications involve a radio frequency (RF) carrier signal that is variously modulated to represent data, and the modulation, transmission, receipt, and demodulation of the signal conform to a set of standards for coordination of the same. A fundamental component of any wireless communications system is the transceiver, that is, the combined transmitter and receiver circuitry. The transceiver encodes the data to a baseband signal and modulates it with an RF carrier signal. Upon receipt, the transceiver down-converts the RF signal, demodulates the baseband signal, and decodes the data represented by the baseband signal. An antenna connected to the transmitter converts the electrical signals to electromagnetic waves, and an antenna connected to the receiver converts the electromagnetic waves back to electrical signals.

The output of the transmitter is connected to a power amplifier, which amplifies the RF signals prior to transmission via the antenna. The receiver is connected to the output of a low noise amplifier, the input of which is connected to the antenna and receives inbound RF signals. A transmit/receive switch selectively interconnects the antenna to the output of the power amplifier during transmission, and to the input of the low noise amplifier during reception. Thus, the power amplifier, the low noise amplifier, and the antenna switch serves as key building blocks in RF transceiver circuitry. These components may be referred to as a front end circuit.

Conventionally, complementary metal oxide semiconductor (CMOS) technology is utilized for the power amplifier and other front end circuitry. Advancements in these processes have made reduced geometry devices possible, but this has also resulted in such amplifiers exhibiting good linearity only at lower power levels.

In further detail, RF power amplifiers of working communication systems are typically operated over a wide dynamic power range. A conventional Class A power amplifier with typical linearity can meet error vector magnitude (EVM) floor requirements at output power below maximum rated linear power levels, but not over the entire power range of the system. Thus, at higher output power levels, without gain expansion, EVM floor requirements cannot be met. Alternatively, class AB/B amplifiers with gain expansion capability can meet high output power requirements, but not the EVM floor requirements at low to mid power levels.

The graph of FIG. 1, in a first plot 1, shows the upper power/EVM limits of a typical RF digital communications system. A second plot 2 shows the EVM floor of a conventional class AB or B power amplifier over an output power range, where the EVM levels remain within acceptable limits at the higher output power levels, but exceed acceptable limits in the middle range of the output power level. A third plot 3 shows the EVM floor of a conventional class A power amplifier over an output power range, where the EVM levels are lower than the acceptable limits until the higher output power levels, and exceeds the acceptable limits before reaching the upper end of the output power range.

One approach combines a number of power amplifiers with a transformer, as described in publication "A linear Multi-Mode CMOS Power Amplifier with Discrete Resizing and Concurrent Power Combining Structure", Jihwan Kim et al., IEEE Journal of Solid State Circuits, Vol. 46, Issue 5, pages 1034-1048, May 2011. The power amplifiers are understood to be biased for class A mode. As described in this publication, however, only 14.5 dBm output power can be achieved with an EVM of 1.8%.

Therefore, there is a need in the art for RF power amplifiers with high output power while maintaining linearity. An alternative modality for controlling an RF power amplifier is needed.

BRIEF SUMMARY

Radio frequency (RF) power amplifiers in which linearity is maintained at high power output levels are disclosed. According to various embodiments, class A amplifiers are utilized for small voltage signals to maintain linearity, while class B or class C amplifiers are used for large voltage signals for high output power levels. Specific amplifiers are activated and deactivated by selective biasing. The outputs of the amplifiers are combined in parallel, with each amplifier circuit including an individual output matching network. The power amplifiers of the present disclosure are contemplated to have low error vector magnitude (EVM) floors as well as high output power levels.

One embodiment of the present disclosure is directed to an RF power combining amplifier circuit, which may have a circuit input and a circuit output. The power combining amplifier circuit may include a first amplifier connected to the circuit input, and to a first bias input. Additionally, there may be a first output matching network that is connected to an output of the first amplifier and to the circuit output. There may also be a second amplifier that is connected to the circuit input, and to a second bias input. The power combining amplifier circuit may further include a second output matching network that is connected to an output of the second amplifier, and to the circuit output. A voltage level of an input signal applied to the circuit input, together with the respective first bias input and the second bias input, may selectively activate the first amplifier and the second amplifier.

The present disclosure will be best understood by reference to the following detailed description when read in conjunction with the accompanying drawings.

BRIEF DESCRIPTION OF THE DRAWINGS

These and other features and advantages of the various embodiments disclosed herein will be better understood with respect to the following description and drawings.

Common reference numerals are used throughout the drawings and the detailed description to indicate the same elements.

DETAILED DESCRIPTION

The detailed description set forth below in connection with the appended drawings is intended as a description of the presently preferred embodiments of voltage mode power combiners for radio frequency (RF) linear power amplifiers. It is not intended to represent the only form in which the present invention may be developed or utilized, and the same or equivalent functions may be accomplished by different embodiments that are also intended to be encompassed within the scope of the invention. It is further understood that the use of relational terms such as first and second and the like are used solely to distinguish one from another entity without necessarily requiring or implying any actual such relationship or order between such entities.

Figure 1:
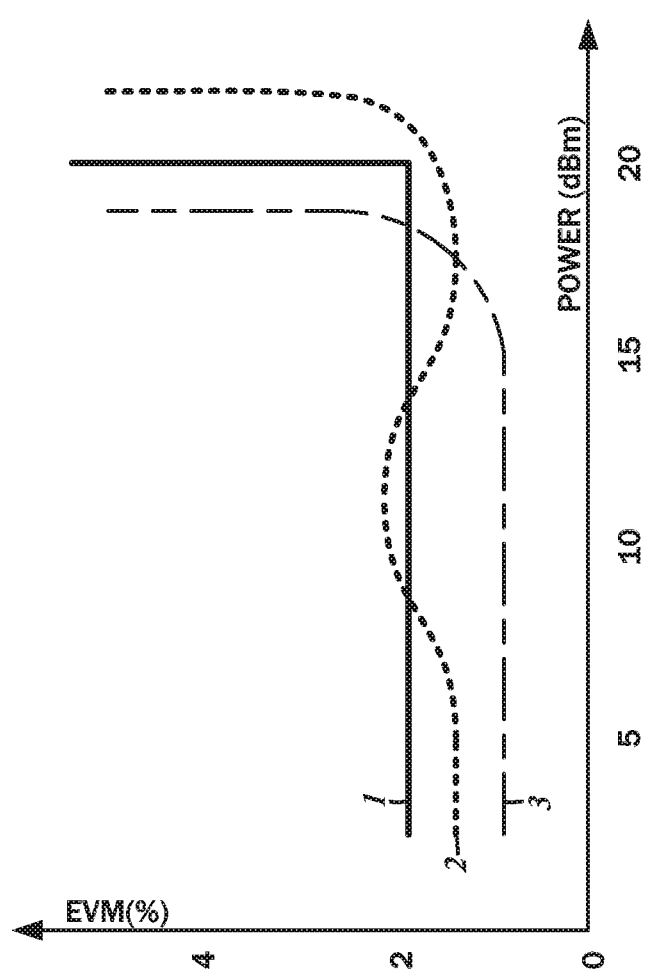
FIG. 1 is a graph showing error vector magnitude floors for a conventional class A amplifier and a conventional class AB or B amplifier, along with upper limits for a conventional RF system over a range of output power levels.
Figure 2:
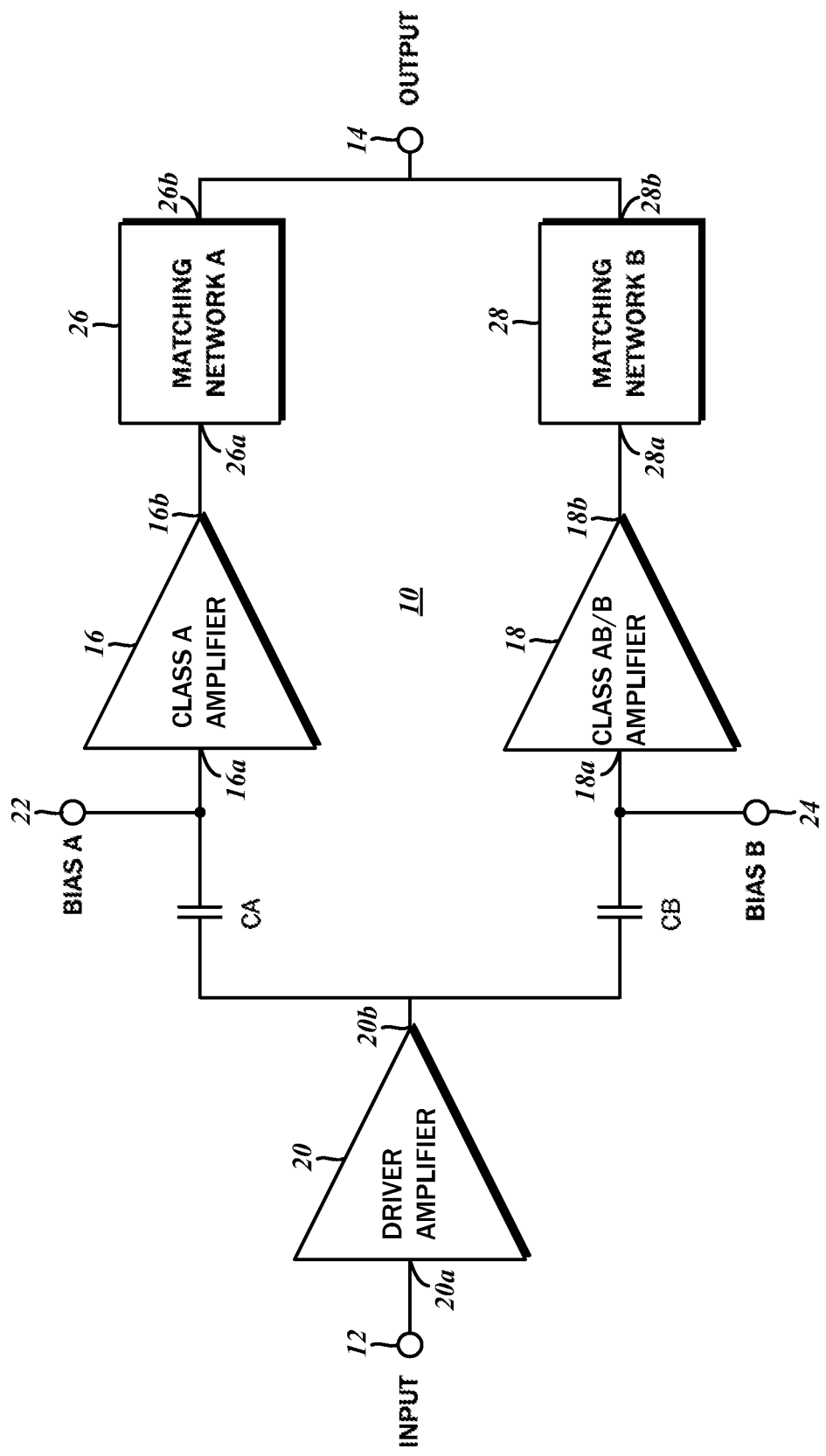
FIG. 2 is a schematic diagram of one embodiment of a power combining amplifier circuit.

With reference to the schematic diagram of FIG. 2, one embodiment of an RF power combining amplifier circuit 10 has an input port 12 and an output port 14. Generally, it is understood that the input port 12 is connected to the output of an RF transmitter (not shown), while the output port 14 is connected to an antenna (not shown).

The RF power combining amplifier circuit 10 also includes a first amplifier 16 and a second amplifier 18. The first amplifier 16 has an input 16a and an output 16b, and likewise, the second amplifier 18 has an input 18a and an output 18b. The input 16a of the first amplifier 16 may be directly or indirectly connected to the input port 12. Along these lines, the input 18a of the second amplifier 18 may be directly or indirectly connected to the input port 12.

In some embodiments, the RF power combining amplifier circuit 10 incorporates a driver amplifier 20, also having an input 20a and an output 20b. In this case, the input 20a of the driver amplifier 20 is connected to the input port 12, and the output 20b of the driver amplifier 20 is connected to the input 16a of the first amplifier 16 and the input 18a of the second amplifier 18. It is contemplated that the driver amplifier 20 is optional, and so as mentioned above, the input 16a of the first amplifier 16 and the input 18a of the second amplifier 18 may be connected directly to the input port 12.

Connected in series with the driver amplifier 20, and specifically the output 20b thereof, and the first amplifier 16, and specifically the input 16a thereof, is a capacitor CA. Similarly connected in series with the driver amplifier 20 and the second amplifier 18, and specifically between the output 20b of the driver amplifier 20 and the input 18a of the second amplifier 18, is a capacitor CB. The capacitors CA and CB are expressly contemplated for allowing the first amplifier 16 and the second amplifier 18 to be biased individually. Also connected to the input 16a of the first amplifier 16 is a first bias input 22, and connected to the input 18a of the second amplifier 18 is a second bias input 24.

In accordance with various embodiments of the present disclosure, the first amplifier 16 is a class A amplifier, where the active element remains conducting for the entirety of the signal cycle (a conducting angle of 360 degrees). The second amplifier 18, on the other hand, is contemplated to be a class B amplifier, where the active element remains conducting for half of the signal cycle (a conducting angle of 180 degrees). Instead of a pure class B amplifier, the second amplifier 18 may be a class AB amplifier in which the active element is biased to remain on during portions of the off cycle. It is understood that the power amplifier class is defined by different biasing levels as provided via first bias input 22 and the second bias input 24. Thus, the first bias input 22 sets the first amplifier 16 for class A operation, and the second bias input 24 sets the second amplifier 18 for class B or class AB operation.

The RF power combining amplifier circuit 10 further includes a first matching network 26 and a second matching network 28. The first matching network 26 has a first port 26a that is connected to the output 16b of the first amplifier 16, and a second port 26b that is connected to the output port 14 of the RF power combining amplifier circuit 10. Similarly, the second matching network 28 has a first port 28a connected to the output 18b of the second amplifier 18, and a second port 28b also connected to the output port 14 of the RF power combining amplifier circuit 10.

The first amplifier 16 and the first matching network 26 may be optimized for small signal linearity, that is, the lowest error vector magnitude (EVM) floor. On the other hand, the second amplifier 18 and the second matching network 28 may be optimized for highest linear output power. The preferable linearity characteristics of a class A amplifier with respect to small and medium power levels are combined with the gain expansion properties of a class B or AB amplifier to meet high output power requirements of the communications system.

Figure 3A:
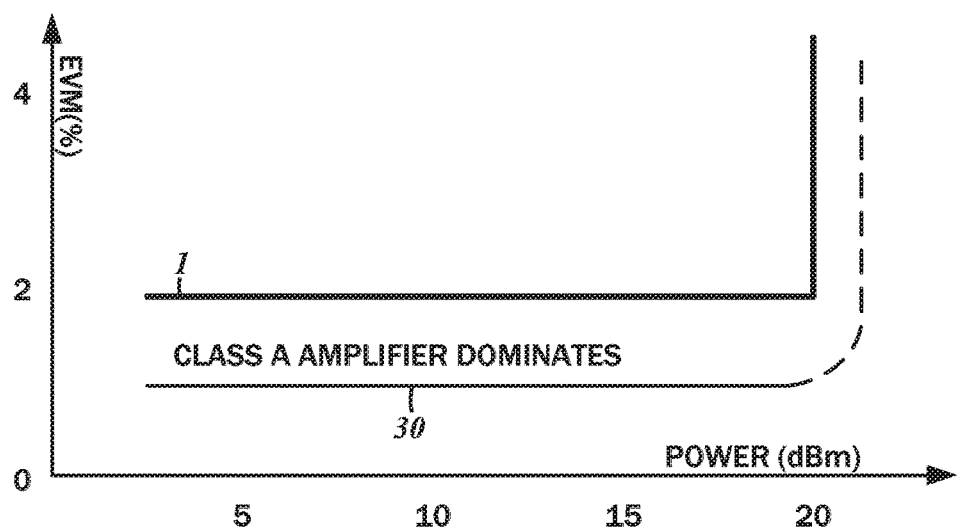
FIG. 3A is a graph showing exemplary error vector magnitudes over a range of power levels applied to the power combining amplifier circuit, with the class A amplifier component dominating.
Figure 3B:
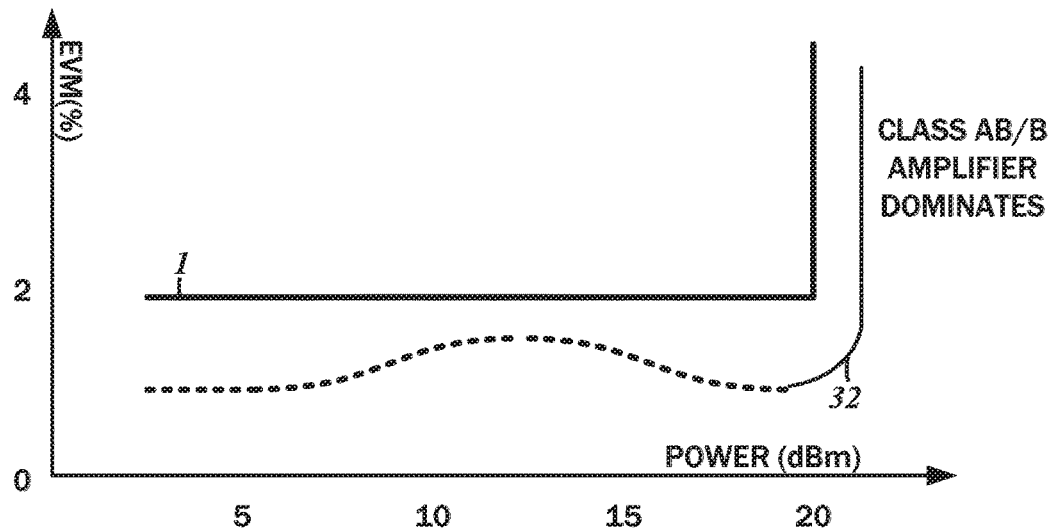
FIG. 3B is a graph showing exemplary error vector magnitudes over a range of power levels applied to the power combining amplifier circuit, with the class AB/B amplifier component dominating.
Figure 3C:
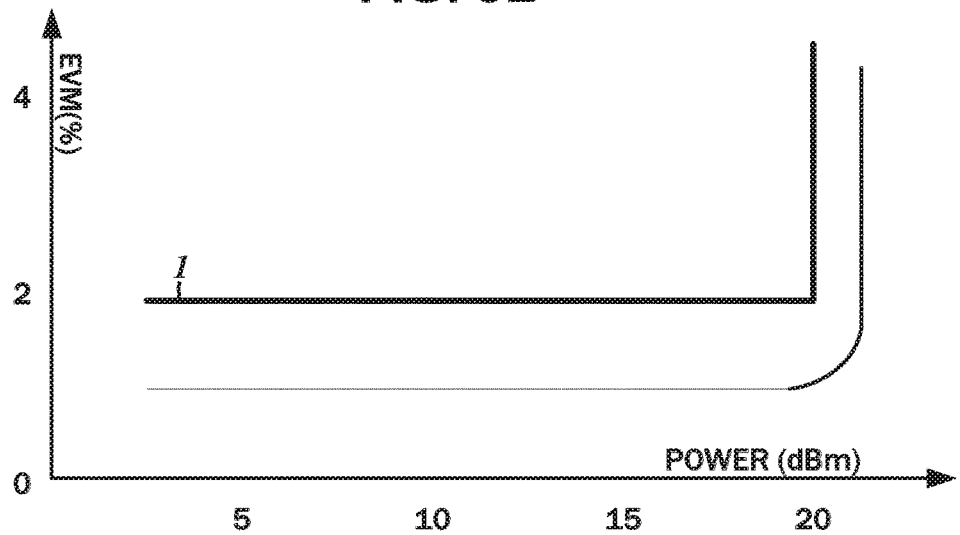
FIG. 3C is a graph showing an exemplary error vector magnitudes in the output signal over a range of output power levels from the power combining amplifier circuit.

The graphs of FIGS. 3A-3C depict the contemplated ideal operation of the RF power combining amplifier circuit 10 are depicted. Specifically, FIG. 3A shows a plot 30 highlighting the lower power level range where low EVM floors are maintained. The first amplifier 16/class A amplifier that is optimized for small signal linearity dominates, with the second amplifier 18/class AB/B amplifier is deactivated. FIG. 3B shows a plot 32 highlighting the high power level range, with the second amplifier 18/class AB/B amplifier being dominant. The graph of FIG. 3C shows that with the combined operation of the first amplifier 16 and the second amplifier 18, EVM figures below maximum thresholds for the communications system can be maintained throughout the entire range of output power levels.

The voltage level of the input signal defines when the first amplifier 16 and the second amplifier 18 are activated. The second bias input 24 is set at such a level that the small signal input does not turn on the active elements of the second amplifier 18. Accordingly, the second amplifier 18 remains deactivated. It is understood that the deactivated second amplifier 18 has no impact on linearity, as only the first amplifier 16 is activated. At the larger signal levels, such as that shown in the highlighted segment of the plot 32 of FIG. 3B, the first amplifier 16 reaches saturation, while the second amplifier 18 is activated due to self-biasing. Higher output power is generated, and while the EVM floor increases, it is contemplated to be within the acceptable standards.

Figure 4:
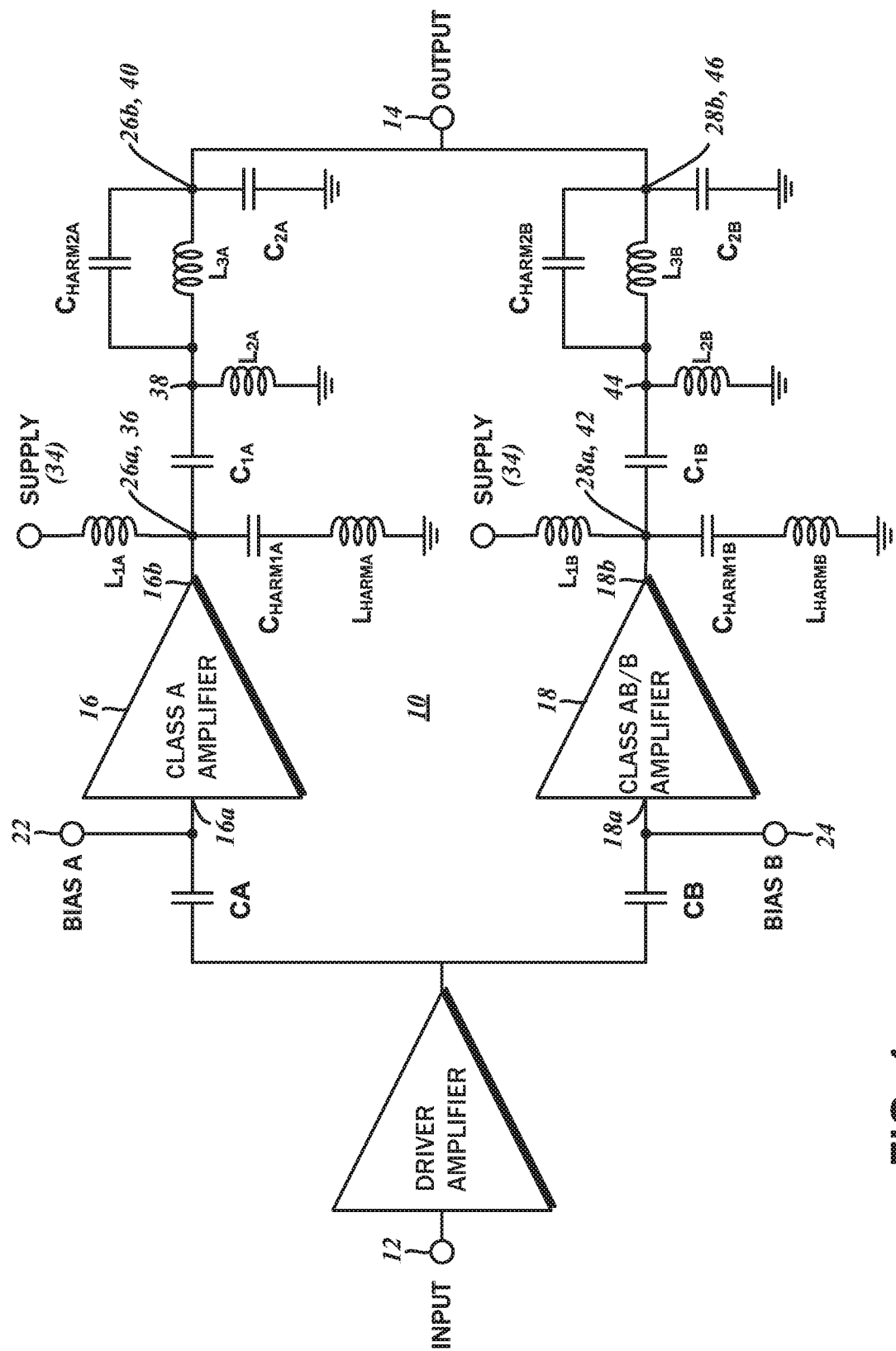
FIG. 4 is a schematic diagram of the power combining amplifier circuit with additional details pertaining to the matching network of the respective class A and class AB/B amplifiers.

Referring now to the schematic diagram of FIG. 4, further details of the first matching network 26 and the second matching network 28 will be considered. A node 36 directly connected to the output 16b of the first amplifier 16 is understood to correspond to the aforementioned first port 26a of the first matching network 26. A supply voltage 34 is connected to this node in series with an inductor $L_{1A}$. Part of a harmonic blocking circuit is comprised of a capacitor $C_{harm1A}$ that is connected to the aforementioned node 36, and is in series within with an inductor $L_{harmA}$ tied to ground. Also connected to the node 36 is a capacitor $C_{1A}$, which together with the inductor $L_{1A}$, defines a first matching circuit. A second matching circuit is defined by the inductor $L_{2A}$ that is connected to the capacitor $C_{1A}$ at a node 38 and ground. An inductor $L_{3A}$ is connected to the node 38 and a node 40 that corresponds to the second port 26b of the first matching network 26. Connected in parallel with the inductor $L_{3A}$ is a capacitor $C_{harm2A}$ that is part of the aforementioned harmonic blocking circuit. A capacitor $C_{2A}$ tied to ground and is part of the second matching circuit, is also connected to the node 40. Those having ordinary skill in the art will be able to ascertain the suitable values for these components for optimal impedance matching.

The second matching network 28 is understood to be similarly configured, with a node 42 directly connected to the output of the second amplifier 18 corresponding to the first port 28a of the second matching network 28. The supply voltage 34 is also connected the node 42 in series with an inductor $L_{1B}$. A capacitor $C_{harm1B}$ is connected in series with an inductor $L_{harmB}$ that is tied to ground. The capacitor $C_{harm1B}$ is connected to the node 42. Also connected to the node 42 is a capacitor $C_{1B}$, which together with the aforementioned inductor $L_{1B}$, define a first matching circuit. The capacitor $C_{1B}$ is connected to a node 44, to which an inductor $L_{2B}$ is connected. Second node and inductor $L_{2B}$ is connected to ground. Additionally connected to the node 44 is an inductor $L_{3B}$, and connected in parallel thereto is a capacitor $C_{harm2B}$ that is part of the harmonics blocking circuit. A node 46 that corresponds to the second port 28b of the second matching network 28 connects the inductor $L_{3B}$ and the capacitor $C_{harm2B}$. A capacitor $C_{2B}$ that defines a second matching circuit together with the inductor $L_{2B}$ is connected to the node 46.

Figure 5:
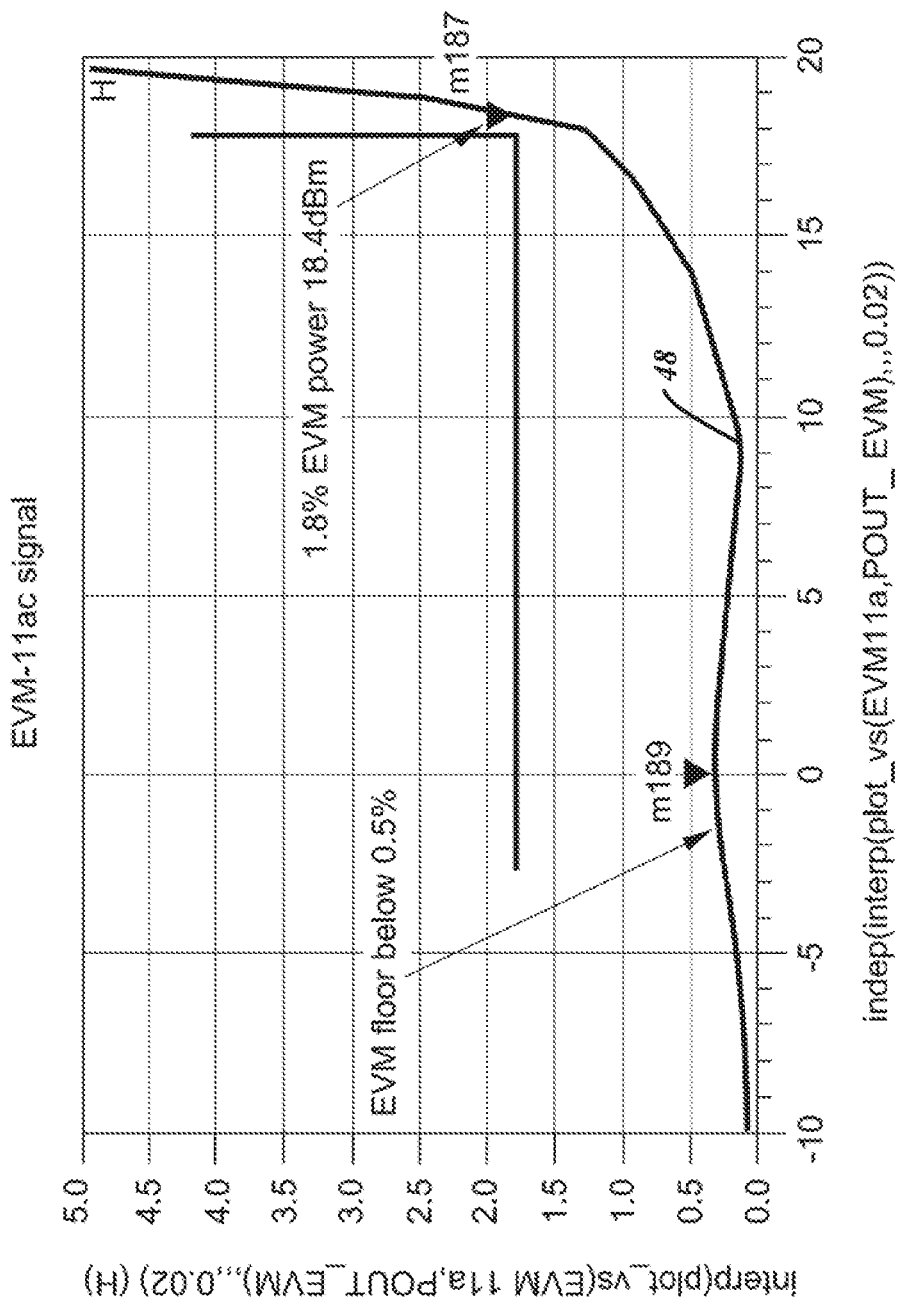
FIG. 5 is a graph of simulated error vector magnitudes over a range of power levels applied to the power combining amplifier circuit.
Figure 6:
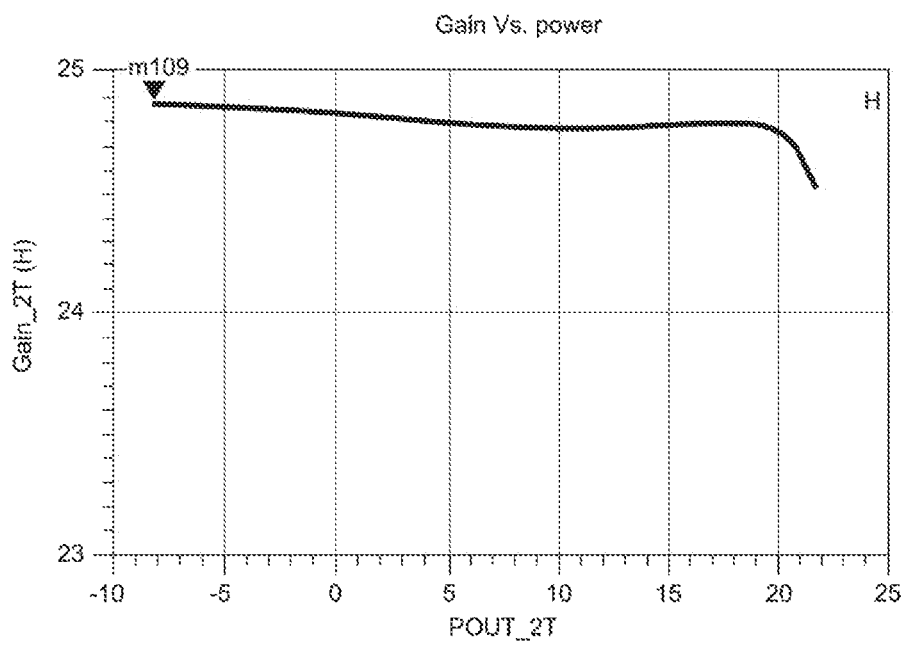
FIG. 6 is a graph of simulated gain of a two tone signal (shown in dB) over a range of power levels applied to the power combining amplifier circuit.
Figure 7:
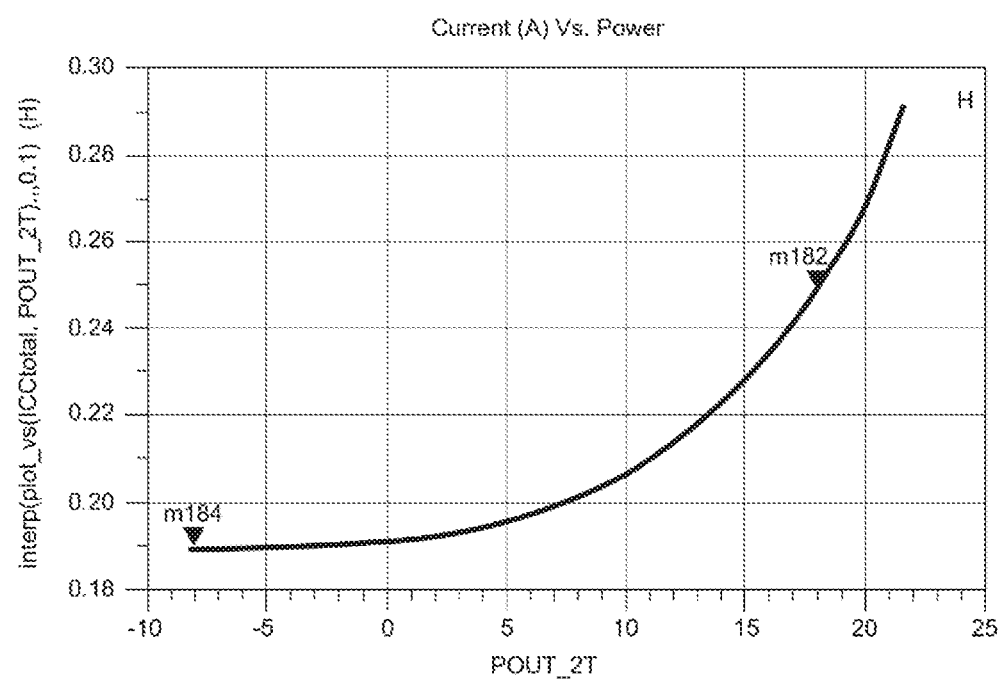
FIG. 7 is a graph of simulated DC current (shown in Amperes) for a two tone signal over a range of power levels applied to the power combining amplifier circuit.

With reference to the graph of FIG. 5, the simulated performance of one embodiment of the RF power combining amplifier circuit 10 is shown. A plot 48 shows the simulated EVM for an 802.11ac Wireless LAN signal over an output power range up to 20 dBm. For the low to medium signal levels, the EVM floor remains below 0.5%, while at 18.4 dBm, the EVM is approximately 1.8%. Additionally, the graph of FIG. 6 plots the gain for a two tone signal over output power of the RF power combining amplifier circuit 10, showing that gain is relatively constant over the entire power range. The graph of FIG. 7 plots the simulated DC current versus output power of the RF power combining amplifier circuit 10 for two tone signal.

The circuitry of the present disclosure may be implemented with any existing metal oxide semiconductor (MOS) process, though any other suitable process may be substituted. The various embodiments of the present disclosure are contemplated to extend the linear output power of CMOS power amplifiers. Additionally, low EVM floors can be maintained because of class A amplifier operating characteristics at small and mid signal levels.

The particulars shown herein are by way of example and for purposes of illustrative discussion of the embodiments of the present disclosure only and are presented in the cause of providing what is believed to be the most useful and readily understood description of the principles and conceptual aspects of the present disclosure. In this regard, no attempt is made to show details of these embodiments with more particularity than is necessary for the fundamental understanding of the present disclosure, the description taken with the drawings making apparent to those skilled in the art how the several forms of the present disclosure may be embodied in practice.

What is claimed is:

1. A radio frequency power combining amplifier circuit with a circuit input and a circuit output, comprising:
   a first amplifier connected to the circuit input and to a first bias input;
   a first output matching network connected to an output of the first amplifier and to the circuit output, the first output matching network and the first amplifier being optimized for small signal linearity;
   a second amplifier connected to the circuit input and to a second bias input, the first and second bias inputs being set such that, when a voltage of an input signal to the circuit input is at a first level, the first amplifier is on and the second amplifier is off and, when a voltage of the input signal is at a second level, the first amplifier is saturated and the second amplifier is on; and
   a second output matching network connected to an output of the second amplifier and to the circuit output, the second output matching network and the second amplifier being optimized for maximum linear output power.

2. The radio frequency power combining amplifier circuit of claim 1 further comprising a driver amplifier defined by a driver input and a driver output, the driver input being connected to the circuit input, and the driver output being connected to the first amplifier and the second amplifier.

3. The radio frequency power combining amplifier circuit of claim 1 wherein the first amplifier is a class A amplifier, and the second amplifier is a class B amplifier.

4. The radio frequency power combining amplifier circuit of claim 1 wherein the first amplifier is a class A amplifier and the second amplifier is a class AB amplifier.

5. The radio frequency power combining amplifier circuit of claim 1 wherein the first bias input is independent of the second bias input.

6. The radio frequency power combining amplifier circuit of claim 1 further comprising a first capacitor connected to an input to the first amplifier and a second capacitor connected to an input to the second amplifier.

7. The radio frequency power combining amplifier circuit of claim 1 wherein the first amplifier, the first output matching network, the second amplifier, and the second output matching network are fabricated on a complementary metal-oxide semiconductor integrated circuit.

8. The radio frequency power combining amplifier circuit of claim 1 wherein each of the first output matching network and the second output matching network includes a harmonic blocking circuit.

9. A radio frequency power combining amplifier circuit with a circuit input and a circuit output, comprising:
   a first amplifier connected to the circuit input and to a first bias input, the first amplifier being defined by a small signal linearity dominance operating region corresponding to a first voltage level of an input signal;
   a first output matching network connected to an output of the first amplifier and to the circuit output;
   a second amplifier connected to the circuit input and to a second bias input, the second amplifier being defined by a gain expansion dominance operating region corresponding to a second voltage level of the input signal, the first and second bias inputs being set such that, when the input signal is at the first voltage level, the first amplifier is on and the second amplifier is off and, when the input signal is at the second voltage level, the first amplifier is saturated and the second amplifier is on; and
   a second output matching network connected to an output of the second amplifier and to the circuit output.

10. The radio frequency power combining amplifier circuit of claim 9 wherein the first amplifier is a class A amplifier, and the second amplifier is a class B amplifier.

11. The radio frequency power combining amplifier circuit of claim 9 wherein the first amplifier is a class A amplifier and the second amplifier is a class AB amplifier.

12. The radio frequency power combining amplifier circuit of claim 9 wherein the first bias input is independent of the second bias input.

13. The radio frequency power combining amplifier circuit of claim 9 further comprising a first capacitor connected to an input to the first amplifier and a second capacitor connected to an input to the second amplifier.

14. The radio frequency power combining amplifier circuit of claim 9 wherein the first amplifier, the first output matching network, the second amplifier, and the second output matching network are fabricated on a complementary metal-oxide semiconductor integrated circuit.

15. A radio frequency integrated circuit with an input and an output, comprising:
   a semiconductor substrate;
   a first amplifier fabricated on the semiconductor substrate and connected to the input and to a first bias input, the first amplifier being defined by a small signal linearity dominance operating region corresponding a first voltage level of a radio frequency signal applied to the input;
   a first output matching network fabricated on the semiconductor substrate and connected to the first amplifier and to the output;
   a second amplifier fabricated on the semiconductor substrate and connected to the input and to a second bias input, the second amplifier being defined by a gain expansion dominance operating region corresponding to a second voltage level of the radio frequency signal applied to the input, the first and second bias inputs being set such that, when the radio frequency signal applied to the input is at the first voltage level, the first amplifier is on and the second amplifier is off and, when the radio signal applied to the input is at the second voltage level, the first amplifier is saturated and the second amplifier is on; and
   a second output matching network fabricated on the semiconductor substrate and connected to the second amplifier and to the output.

16. The radio frequency integrated circuit of claim 15 wherein the semiconductor substrate is a complementary metal-oxide type.

17. The radio frequency integrated circuit of claim 15 wherein the first amplifier is a class A amplifier, and the second amplifier is a class B amplifier.

18. The radio frequency integrated circuit of claim 15 wherein the first amplifier is a class A amplifier and the second amplifier is a class AB amplifier.

19. The radio frequency integrated circuit of claim 15 wherein the first bias input is independent of the second bias input.

20. The radio frequency integrated circuit of claim 15 further comprising a first capacitor connected to an input to the first amplifier and a second capacitor connected to an input to the second amplifier.

* * * * *